United States Patent
D'Arrigo et al.

(10) Patent No.: US 6,506,658 B2
(45) Date of Patent: Jan. 14, 2003

(54) METHOD FOR MANUFACTURING A SOI WAFER

(75) Inventors: Giuseppe D'Arrigo, Tremestieri Etneo (IT); Corrado Spinella, Catania (IT); Salvatore Coffa, Tremestieri Etneo (IT); Giuseppe Arena, Catania (IT); Marco Camalleri, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/752,149

(22) Filed: Dec. 29, 2000

(65) Prior Publication Data

US 2001/0023094 A1 Sep. 20, 2001

(30) Foreign Application Priority Data

Dec. 31, 1999 (EP) ................................................ 99830826

(51) Int. Cl.[7] ........................................... H01L 21/331
(52) U.S. Cl. ..................... 438/359; 438/309; 438/341
(58) Field of Search ................... 438/370, 526, 438/409, 960, 309, 312, 341, 313

(56) References Cited

U.S. PATENT DOCUMENTS

| 5,686,342 A | * 11/1997 | Lee | 438/409 |
| 6,140,196 A | * 10/2000 | Tung | 438/341 |

FOREIGN PATENT DOCUMENTS

| EP | 0226091 | 6/1987 | H01L/21/76 |
| FR | 2564241 | 11/1985 | H01L/21/84 |
| WO | 93/10559 | 5/1993 | H01L/21/76 |

* cited by examiner

Primary Examiner—David Nelms
Assistant Examiner—Dung Anh Le
(74) Attorney, Agent, or Firm—Lisa K. Jorgenson; Allen, Dyer, Doppelt, Milbrath & Gilchrist, P.A.

(57) ABSTRACT

A method for fabricating a silicon-on-insulator (SOI) wafer that includes a monocrystalline silicon substrate with a doped region buried therein is provided. The method includes forming a plurality of trench-like openings extending from a surface of the substrate to the doped buried region, and selectively etching through the plurality of trench-like openings to change the doped buried region into a porous silicon region. The porous silicon region is oxidized to obtain an insulating region for the SOI wafer.

29 Claims, 4 Drawing Sheets

METHOD FOR MANUFACTURING A SOI WAFER

FIELD OF THE INVENTION

The present invention relates to a method of fabricating a silicon-on-insulator (SOI) wafer suitable to manufacture semiconductor electronic devices. The wafer includes a substrate of monocrystalline silicon having a doped region buried therein.

BACKGROUND OF THE INVENTION

As an alternative to wafers made of only silicon, there are composite wafers. In recent years in the microelectronic industry, composite wafers have been proposed. Composite wafers are known as SOI wafers, which comprise at least two silicon layers. One of the which is thinner than the other, and an isolation layer of silicon oxide is between the two silicon layers. For a discussion on SOI wafers, reference can be made, for instance, to the article "Silicon-on-Insulator Wafer Bonding-Wafer Thinning Technological Evaluations" by Hausman et al., Japanese Journal of Applied Physics, Vol. 28, No. 8, August 1989, pages 1426–1443.

The Silicon-On-Insulator isolation technology has recently aroused considerable interest because integrated circuits having a substrate formed of SOI wafers have several advantages over circuits formed on traditional substrates made of monocrystalline silicon only. The main advantages are as follows: a reduction in the parasitic capacitance; increase in the switching speed; a greater immunity to noise; less leakage currents; no latch-up of parasitic components; greater resistance to radiation effects; and an increase of the component packaging density.

However, the application of integrated devices based on SOI substrates is severely limited, in particular, by the high cost of SOI wafers. As described in the above referenced article, a typical method of manufacturing SOI wafers comprises bonding two wafers of monocrystalline silicon together. According to such a process, one of the two wafers is subjected to an oxidation step, which allows formation of an oxide layer on one surface. The oxide layer surface is then cleaned and bonded to the other wafer. The SOI wafers thus obtained exhibit excellent electrical characteristics but are cost-intensive.

Another method, commonly known as SIMOX (Separation by IMplants of OXygen), comprises the implantation of oxygen atoms into the wafer to bring the oxide thickness into the 100 to 200 nm range. This and other methods are described in an article "SOI Technologies: Their Past, Present and Future" by J. Haisha, Journal de Physique, Colloque C4, Supplement an N. 9, Tome 49, September 1988. Although these techniques produce the SOI structure using a single wafer, they have certain disadvantages. These disadvantages include the inability to accept the application of high voltages, as in case of SIMOX technology, and the high fault rate due to crystal defects produced by the stress induced by the buried oxide.

Another known method of fabricating SOI wafers at a low cost is described in the European Patent No. 98830299.8 and dated May 15, 1998. This application is incorporated herein by reference in its entirety, and is assigned to the assignee of the present invention. This method comprises the following steps. A substrate of monocrystalline silicon is subjected to a thermal oxidation step to grow a silicon oxide layer over its surface. Certain oxide areas are removed, wherein ions with dopant opposite to the substrate are implanted and diffused. This is done to provide a number of areas with dopants opposite the substrate, which are beneath the top surface of the substrate. An epitaxial layer is grown with the same dopant and concentration as the substrate.

The method further includes again subjecting the semiconductor to a thermal oxidation step, and etching to define trench-like openings extending from the surface to the buried regions. The wafer is dipped into an electrolytic solution in a galvanic cell. The wafer is subjected to a selective electrochemical etching step of the areas having an opposite dopant to the substrate, resulting in porosity formation. The wafer is further subjected to thermal oxidation so that the porous regions are changed into oxidized regions. The oxidized regions are removed to leave a buried cavity, and new oxidation fills in the trench-like openings and the buried cavity with oxide.

Although in many ways advantageous, this method has a drawback in that the processing sequence described above is burdened with a large number of steps. Furthermore, a fairly high rate of crystal defects is to be expected from such a sequence. Since the rate of thermal oxidation is not constant along all the walls of the structure, and especially at the corners thereof, some of the trench-like openings will tend to close in advance. This causes a wedging effect and a consequent high stress, which will be relieved through the formation of crystal defects.

SUMMARY OF THE INVENTION

The underlying technical problem of the present invention is to provide a low-cost method of fabricating SOI wafers showing a high yield, and which is suitable to manufacture electronic devices monolithically integrated on a semiconductor.

The concept behind this invention is one of turning the doped buried region, which is trapped within the substrate of monocrystalline silicon, into a region of porous oxide having electrical and physical properties similar to those of a thermal oxide.

Briefly stated, according to the invention the method comprises a step of forming trench-like openings extended from the substrate surface to the buried region. A selective etching step is performed, which is to be carried out through the openings in order to turn the buried region of monocrystalline silicon into porous silicon. The porous silicon is oxidized to produce an insulating portion of the SOI wafer.

BRIEF DESCRIPTION OF THE DRAWINGS

The features and advantages of the method according to this invention can be appreciated from the following description of an embodiment thereof, given by way of illustration and not of limitation with reference to the accompanying drawings.

DETAILED DESCRIPTION OF THE PREFERRED EMBODIMENTS

The process steps and the structures described hereinafter do not form an exhaustive process flow for manufacturing integrated circuits. This invention actually can be practiced in combination with integrated circuit manufacturing techniques currently used in the industry. Only conventional process steps necessary to understand the invention will be described.

Figure 1A:
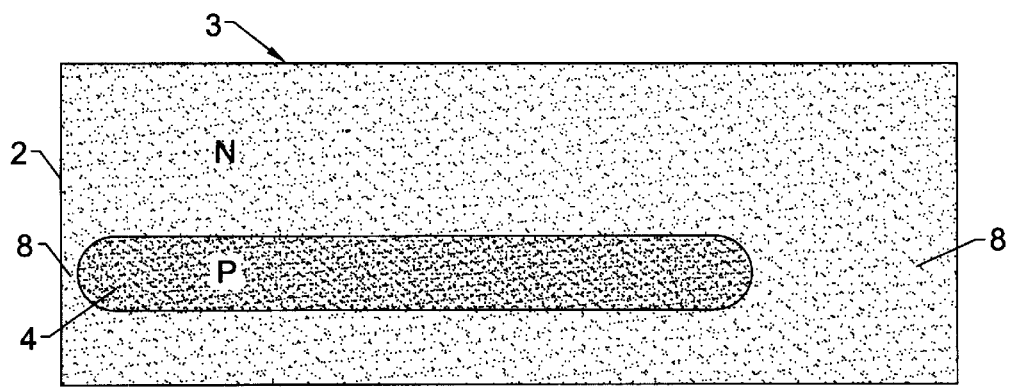
FIGS. 1a–1f schematically show an enlarged vertical cross-section view of a semiconductor substrate being chronologically subjected to the various steps according to the present invention.

The figures showing cross-sections through portions of an integrated circuit are not drawn to scale, but they rather highlight major features of the invention. Referring to such figures, and especially to the example of FIG. 1a, a substrate 2 of monocrystalline silicon, e.g., of the n-type, is schematically shown. The substrate 2 has a top surface 3 and includes a doped region 4, e.g., of the p-type, buried in the substrate. The regions 8 represent doped regions adjacent the buried region 4.

At selected areas, the substrate 2 is subjected to an etching step, for instance, by an APCVD (Atmosphere Pression Chemical Vapor Deposition) process phase, which allows definition of trench-like openings. In essence, an oxide 5 is first grown over the surface 3 of the substrate 2. Thereafter, the oxide 5 is etched away using a mask to form openings or trenches 6 which extend from the surface 7 of the oxide 5 down to the doped regions 8 adjacent to the buried region 4, as illustrated in FIG. 1b.

Figure 1B:
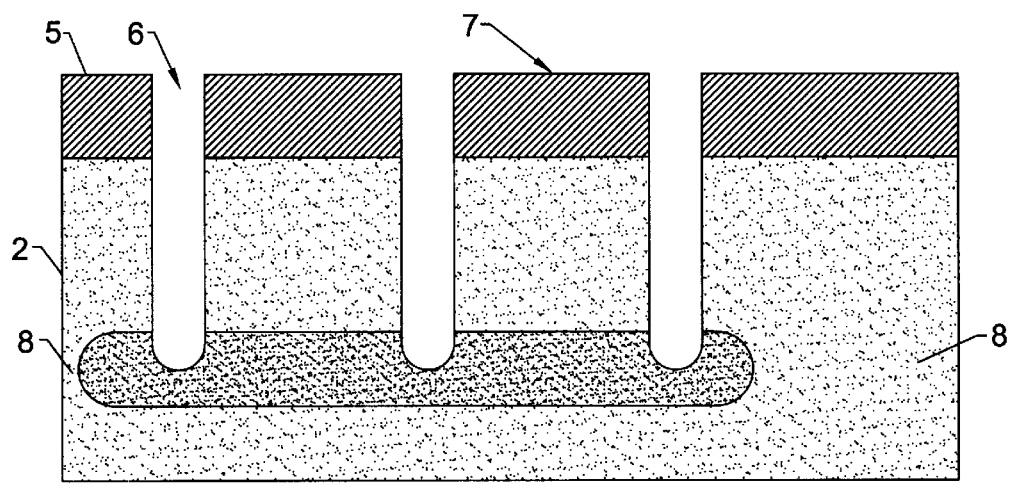
Figure 1C:
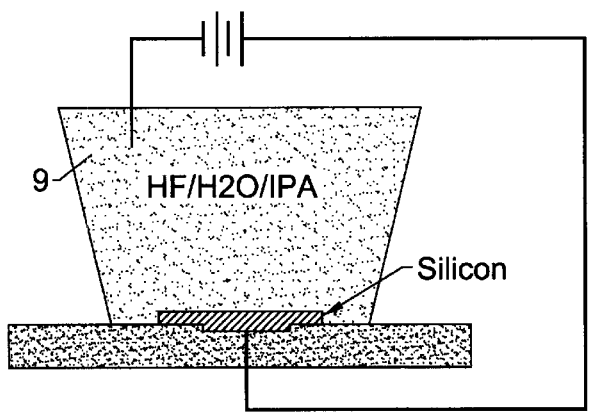

Following the formation of the trenches 6, the oxide layer 5 is removed, and the structure visible in FIG. 1b is subjected to electrochemical etching as shown in FIG. 1c. This type of etch is applied in an electrochemical cell 9 containing a solution of water ($H_2O$) and hydrofluoric acid (HF). A solvent, such as isopropyl acid, can be added to this solution.

Figure 1D:
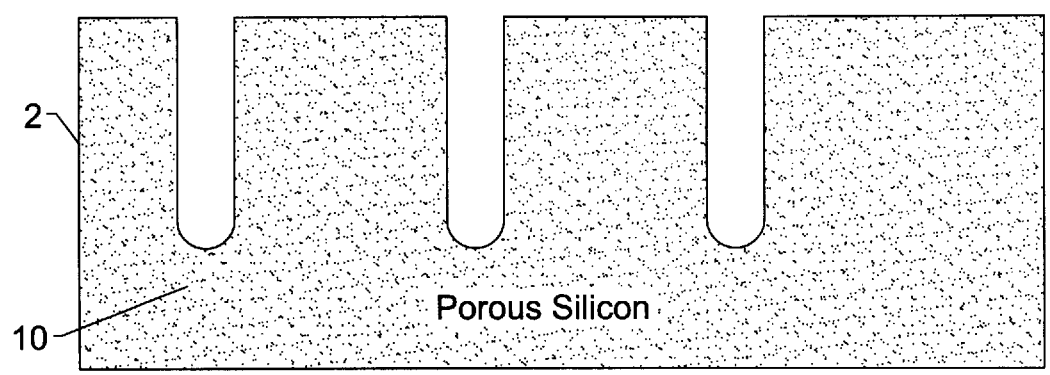

The semiconductor structure shown in FIG. 1b is placed on the anode of the cell 9 at a positive potential with respect to the cell cathode. The potential can be, for example, 0.5 volts. By utilizing the difference of potential between the substrate 2 of monocrystalline silicon and the buried region 4, and suitably modulating the dopant distribution, the doped buried region 4 is turned into a region 10 of porous silicon. This provides a structure as shown in FIG. 1d. The dopant concentration should be equal to or greater than $10^{16}$ atoms/$cm^3$, for example. However, any concentration that provides an adequate result is acceptable.

In addition, the electrochemical etching process has infinite selectivity, such as from 1 to 1000. In other words, the etch is only selective with respect to the buried region 4. This is due to the fact that the electrochemical etch reactions cannot take place on the n-type region which, being at a lower potential than the p-type regions, acts as the cathode.

Figure 2A:
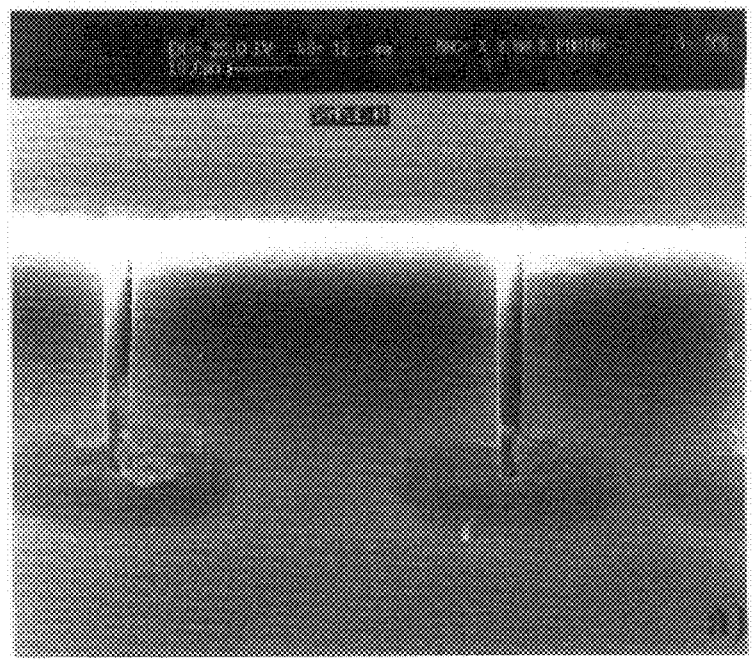
FIG. 2a is a SEM image of the semiconductor substrate illustrated in FIG. 1d showing the effect of an electrochemical etch for producing a porous silicon region in accordance with the present invention.
Figure 2B:
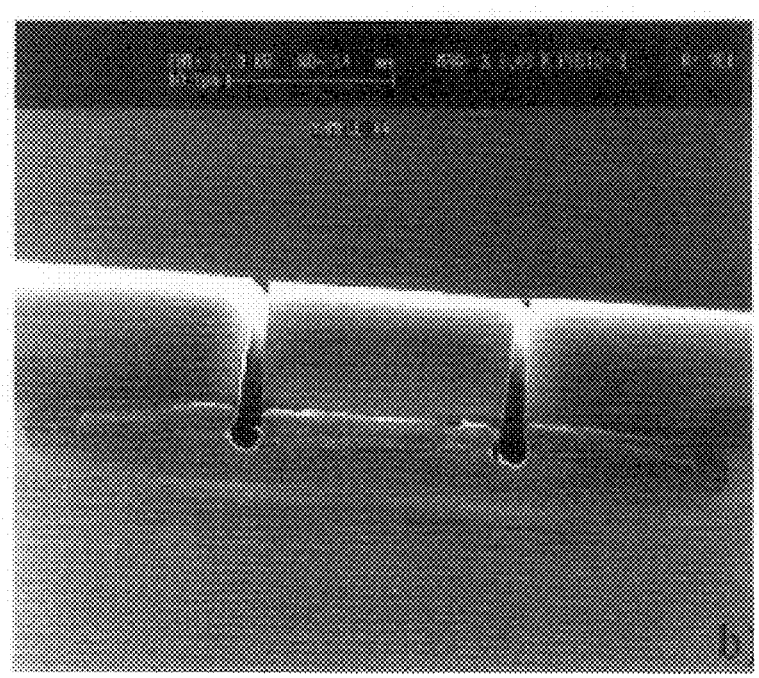
FIG. 2b is a SEM image of an isolation layer (which is approximately 20 μm wide) between trenches in accordance with the present invention.

The porous silicon region extends all across the buried region. Accordingly, regions extending from one trench to an adjacent trench can be interconnected so that the buried doped region is formed through only one of the trenches. The SEM image shown in FIGS. 2a and 2b illustrate the formation of the porous silicon.

Figure 1E:
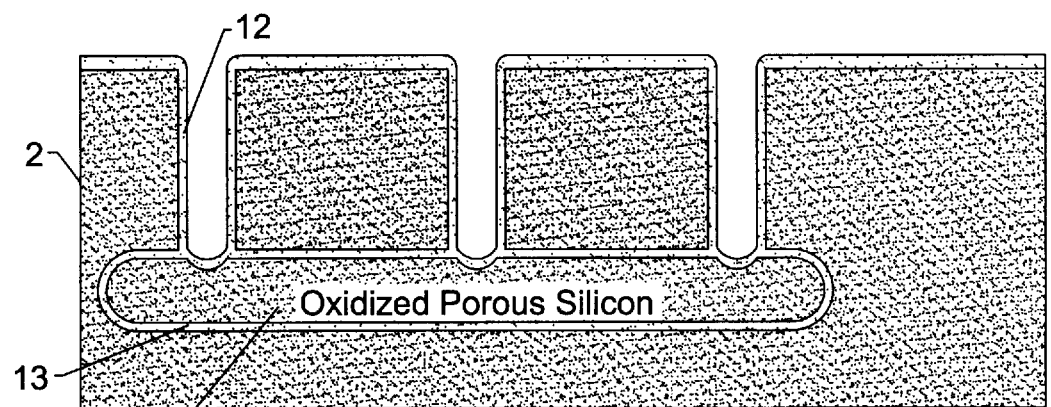
Figure 3:
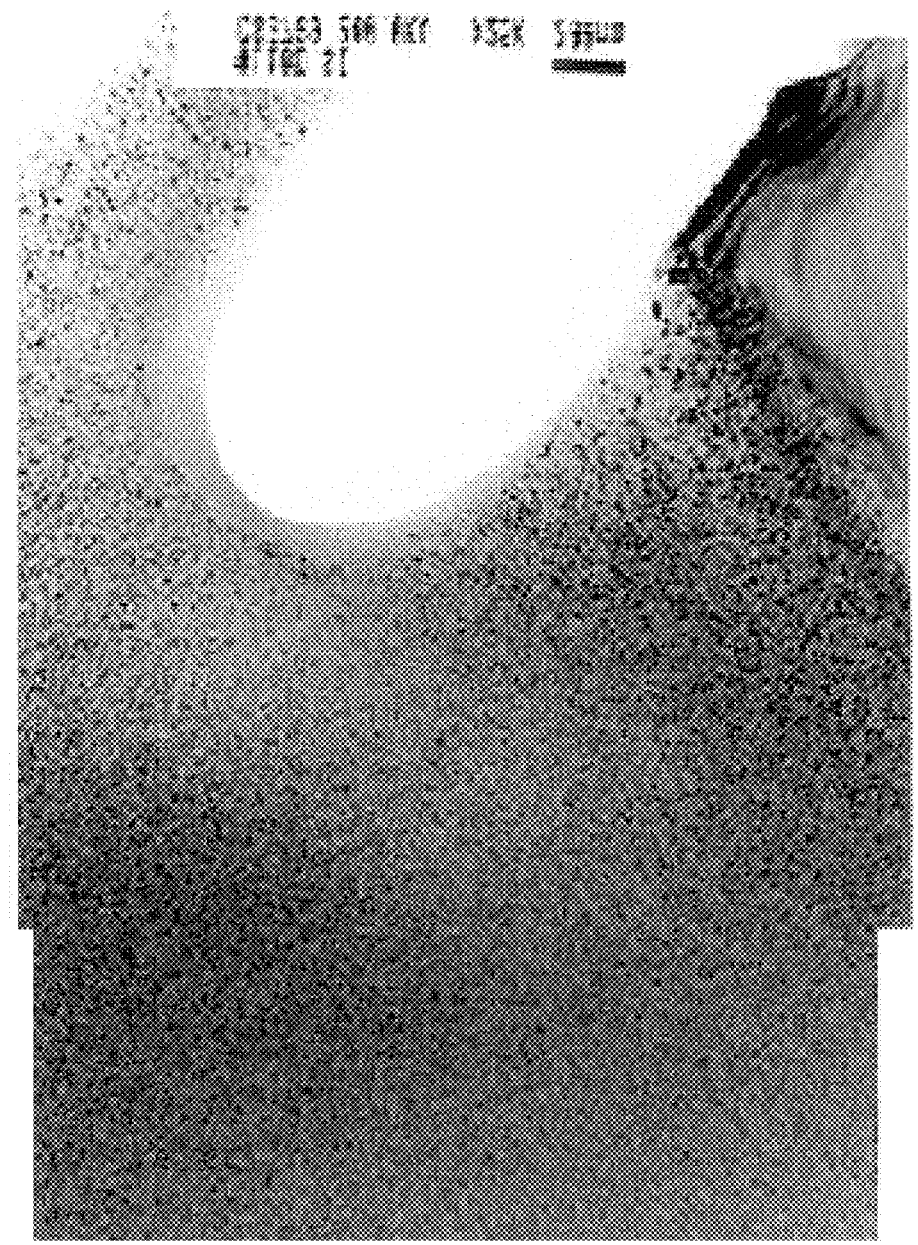
FIG. 3 shows a TEM (Transmission Electron Microscopy) image of a porous silicon region as obtained by the method according to the present invention.

Subsequently, as shown in FIG. 1e, the porous silicon region formed by electrochemical etching is converted to an oxide region 11. This conversion is obtained by thermal oxidation, for example. Alternatively, an anodic oxidation within an electrolytic cell containing no HF could be applied. This oxidation step produces the oxidation of the porous silicon region, and causes a silicon oxide 12 to be grown also along the trench walls. An oxide 13 is also grown at the interface between the region 11 of oxidized porous silicon and the region 2 of monocrystalline silicon. In this way, the structure shown in FIG. 1e is obtained. The TEM vertical cross-section reproduced in FIG. 3 shows that the whole buried region 4 has been oxidized, and that the SOI structure produced exhibits neither large defective regions nor regions of high stress.

Figure 1F:
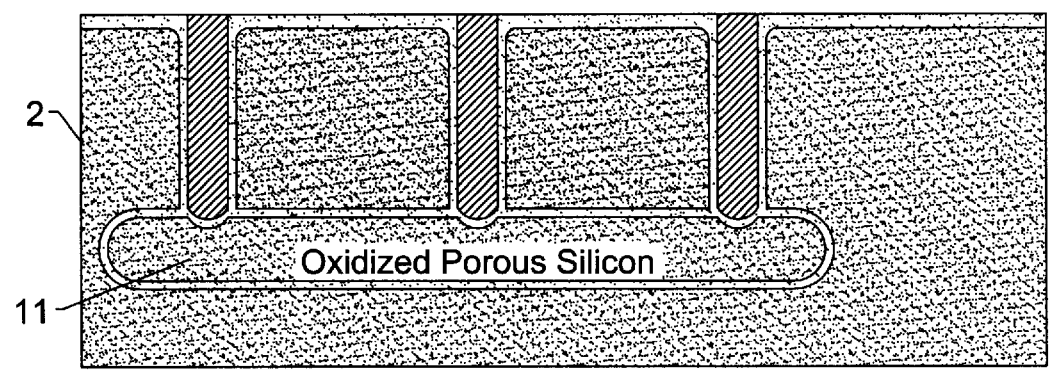

Lastly, in a conventional way, a planarizing step is carried out on the SOI wafer to fill the trenches 6 with polysilicon, and an additional etching step is applied to the polysilicon itself, yielding the SOI wafer shown in FIG. 1f.

Using the method described above, SOI wafers can be produced by comparable techniques to those of the standard process used in the microelectronics industry and, therefore, at a much lower cost than by current SOI substrate manufacturing processes and with high levels of repeatability and reliability.

Standard electronic components can be fabricated inside and/or outside the monocrystalline silicon region overlying the region of oxidized porous silicon in accordance with standard microelectronics techniques or in different (pressure, gas, temperature, etc.) sensors, and microintegrated mechanical structures, such as gyroscopes, micromotors, etc.

That which is claimed is:

1. A method for fabricating a silicon-on-insulator (SOI) wafer comprising a monocrystalline silicon substrate with a doped region buried therein, the method comprising:

forming a plurality of trench-like openings extending from a surface of the substrate to the doped buried region;

selectively etching through the plurality of trench-like openings to change the doped buried region into a porous silicon region; and oxidizing the porous silicon region to obtain an insulating region for the SOI wafer.

2. A method according to claim 1, wherein selectively etching comprises subjecting the substrate to an electrochemical etching within an electrolytic cell.

3. A method according to claim 2, wherein the electrolytic cell contains an aqueous solution comprising hydrofluoric acid and a solvent for promoting formation of the porous silicon region.

4. A method according to claim 2, wherein the substrate is placed on an anode of the electrolyte cell at a positive potential with respect to a cathode of the electrolyte cell.

5. A method according to claim 4, wherein the potential is about 0.5 volts.

6. A method according to claim 4, wherein the porous silicon region is obtained by utilizing a difference of potential between the substrate and the doped buried region and by modulating a dopant distribution thereof.

7. A method according to claim 1, wherein the doped region is not degenerate.

8. A method according to claim 7, wherein the doped region is a p-type region having a doping concentration of about $10^{16}$ atom/$cm^3$.

9. A method according to claim 1, wherein formation of the porous silicon region is initiated by only one of the plurality of trench-like openings and formation propagates therefrom towards the other trench-like openings.

10. A method according to claim 1, wherein selectively etching is selective only with respect to the doped buried region.

11. A method according to claims 10, wherein selectively etching creates a smooth surface at an interface between the porous silicon region and the substrate.

12. A method according to claim 1, wherein oxidizing comprises a thermal oxidation.

13. A method according to claim 1, wherein oxidizing produces oxidation of the porous silicon region and causes a growth of silicon oxide along walls of the plurality of trench-like openings and along an interface between the porous silicon region and the substrate.

14. A method according to claim 1, further comprising:
    filling the plurality of trench-like openings with polysilicon; and
    planarizing a top surface of the substrate including the plurality of trench-like openings filled with polysilicon.

15. A method according to claim 14, further comprising etching the polysilicon.

16. A method for fabricating a silicon-on-insulator (SOI) wafer comprising a monocrystalline silicon substrate with a doped region buried therein, the method comprising:
    forming a plurality of trench-like openings extending from a surface of the substrate to the doped buried region;
    selectively etching through the plurality of trench-like openings;
    subjecting the substrate to an electrochemical etching within an electrolytic cell to change the doped buried region into a porous silicon region; and
    oxidizing the porous silicon region to obtain an insulating region for the SOI wafer.

17. A method according to claim 16, wherein the electrolytic cell contains an aqueous solution comprising hydrofluoric acid and a solvent for promoting formation of the porous silicon region.

18. A method according to claim 16, wherein the substrate is placed on an anode of the electrolyte cell at a positive potential with respect to a cathode of the electrolyte cell.

19. A method according to claim 16, wherein the potential is about 0.5 volts.

20. A method according to claim 16, wherein the porous silicon region is obtained by utilizing a difference of potential between the substrate and the doped buried region and by modulating a dopant distribution thereof.

21. A method according to claim 16, wherein the doped region is not degenerate.

22. A method according to claim 21, wherein the doped region is a p-type region having a doping concentration of about $10^{16}$ atom/cm$^3$.

23. A method according to claim 16, wherein formation of the porous silicon region is initiated by only one of the plurality of trench-like openings and formation propagates therefrom towards the other trench-like openings.

24. A method according to claim 16, wherein selectively etching is selective only with respect to the doped buried region.

25. A method according to claim 24, wherein selectively etching creates a smooth surface at an interface between the porous silicon region and the substrate.

26. A method according to claim 16, wherein oxidizing comprises a thermal oxidation.

27. A method according to claim 16, wherein oxidizing produces oxidation of the porous silicon region and causes a growth of silicon oxide along walls of the plurality of trench-like openings and along an interface between the porous silicon region and the substrate.

28. A method according to claim 16, further comprising:
    filling the plurality of trench-like openings with polysilicon; and
    planarizing a top surface of the substrate including the plurality of trench-like openings filled with polysilicon.

29. A method according to claim 28, further comprising etching the polysilicon.

* * * * *